United States Patent [19]

Titus

[11] 4,092,617

[45] May 30, 1978

[54] WIDE POWER RANGE MICROWAVE FEEDBACK CONTROLLER

[76] Inventor: James C. Fletcher, Administrator of the National Aeronautics and Space Administration, with respect to an invention of Leo E. Titus, Torrance, Calif.

[21] Appl. No.: 782,480

[22] Filed: Mar. 29, 1977

[51] Int. Cl.² ............................................. H03H 1/04
[52] U.S. Cl. ................................. 333/17 R; 325/159; 325/187; 333/81 R
[58] Field of Search ........................... 333/17 R, 81 R; 330/144, 145, 284; 325/144, 150, 159, 186, 187; 323/22 R

[56] References Cited

U.S. PATENT DOCUMENTS 3,119,077  1/1964  Saari ................................ 333/17 R X
3,226,653  12/1965  Miller ................................ 330/284 X

*Primary Examiner*—Paul L. Gensler
*Attorney, Agent, or Firm*—Ronald F. Sandler; John R. Manning; John O. Tresansky

[57] ABSTRACT

A substantially constant power level is derived over a predetermined frequency band, in each of a plurality of relatively widely spaced power ranges, from a microwave load having a predetermined amplitude versus frequency response, such as an antenna. A microwave source of substantially constant amplitude drives a forward path connected between the source and the load. The forward path includes a voltage controlled, PIN diode, variable microwave attenuator. A feedback path responsive to the microwave power level in the forward path derives a control voltage for the PIN attenuator. The feedback path includes a microwave equalizer attenuator having an amplitude versus frequency response corresponding substantially with the amplitude versus frequency response of the load. The equalizer attenuator drives a linear, crystal amplitude detector. Attenuating means included in the forward and feedback paths are selectively connected in circuit to maintain the power level of the microwave input to the amplitude detector substantially constant, even though different power ranges ae supplied to the load by the forward path.

10 Claims, 1 Drawing Figure

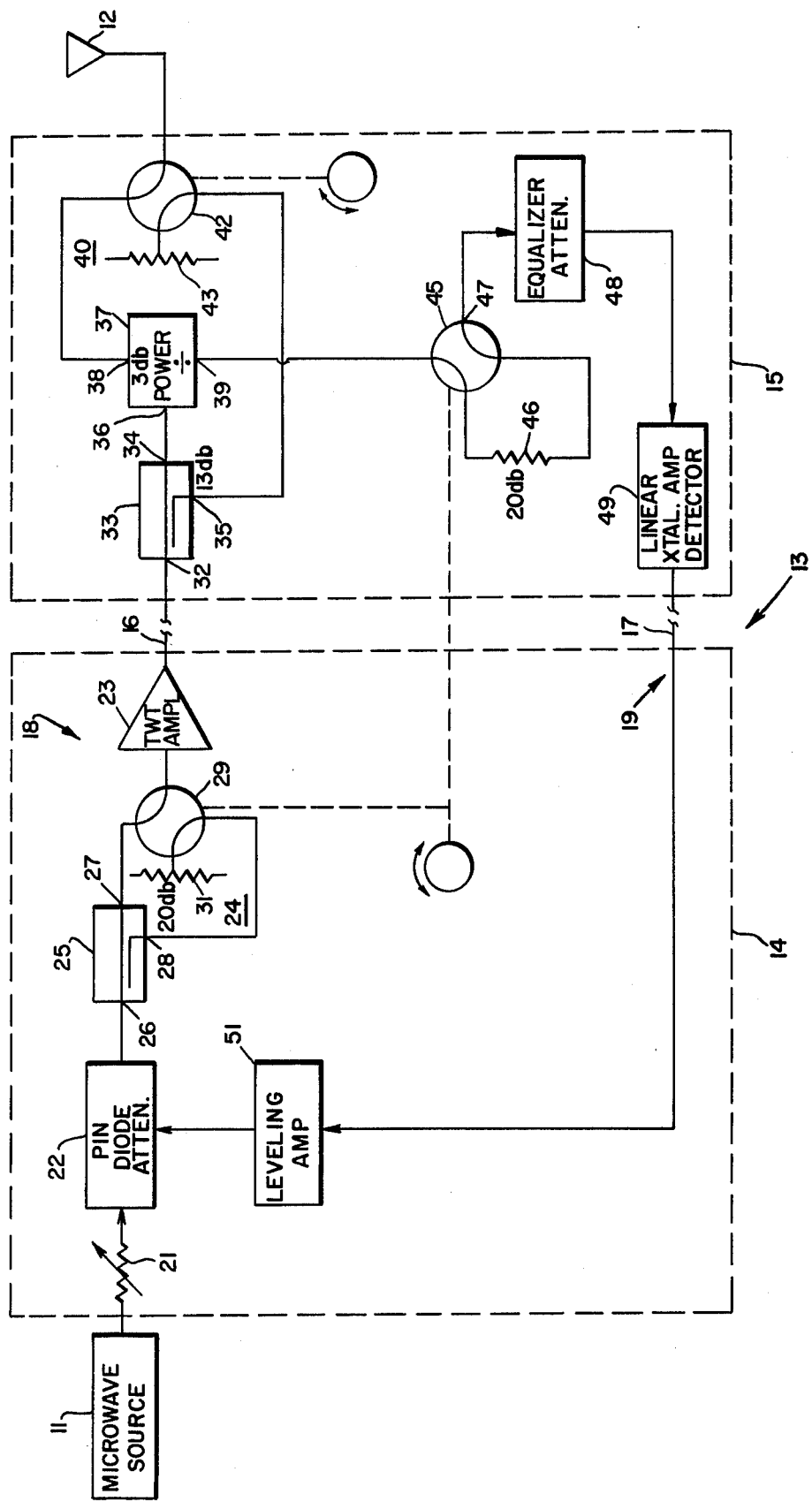

WIDE POWER RANGE MICROWAVE FEEDBACK CONTROLLER

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 U.S.C. 2457), and may be manufactured and used by or for the Government for governmental purposes without the payment of any royalties thereon or therefor.

FIELD OF THE INVENTION

The present invention relates generally to apparatus for controlling the power derived from a microwave load, and more particularly to an apparatus for controlling the power derived from a microwave load in each of a plurality of relatively widely spaced power ranges by employing a plurality of attenuating means that are selectively connected in circuit with forward and feedback paths.

BACKGROUND OF THE INVENTION

For certain applications, it is necessary to derive a relatively constant output power from a microwave load in each of a plurality of relatively widely spaced amplitude ranges. The load is likely to have a sloping amplitude versus frequency response over a band that is driven by a microwave source. In one particular application of this nature, a microwave transmitter drives an antenna so that the antenna has an equivalent isotropic radiated power (EIRP, a parameter defined by the product of antenna gain and radiated power) versus frequency characteristic over approximately a 10% band width; for example, from approximately 5.0 to 5.5 GHz. In addition, the output power from the antenna must be maintained level in each of four steps, displaced by 10 db, over a 30 db range.

Maintaining the EIRP of the antenna constant to meet these requirements is difficult because control elements in a feedback path that monitors the power coupled to the antenna and which controls the power coupled between a substantially constant amplitude microwave source and the antenna load generally do not include readily available components that are capable of handling input signals over a 30 db level. In particular, to control the amplitude of the power derived from the antenna in each of the power ranges, it is desirable to employ a linear, crystal amplitude detector in the feedback path. The generally available detectors of this type usually have linear input-output characteristics only over a relatively narrow range of input amplitudes. Generally available linear amplitude detectors are incapable of providing a linear output response over a 30 db range of input signals.

BRIEF DESCRIPTION OF THE INVENTION

In accordance with one aspect of the invention, the power derived from a microwave load in each of a plurality of relatively widely spaced power levels is maintained substantially constant by employing an apparatus incuding a forward path responsive to a relatively constant microwave source and a feedback path responsive to the power in the forward path and which derives a control signal for the attenuator in the forward path. The attenuator is preferably a PIN diode attenuator that functions in connection with a microwave amplifier as a variable gain device. The feedback path includes a linear crystal amplitude detector that derives a control signal for the PIN attenuator of the forward loop. The amplitude detector preferably has a linear input-output characteristic, but this characteristic subsists only over a relatively narrow range of input amplitudes. Hence, the amplitude detector can be considered as having a desired input-output response over only a relatively narrow range of input amplitudes to it and the input to the detector should be maintained in this range, even though the power supplied to the load can be varied over a much greater range, such as 30 db or more.

To maintain the input level to the amplitude detector within the narrow range, even though the power derived from the load is varied over a wide amplitude range, the forward and feedback paths are provided with selectively connected attenuators that vary the power range supplied to the load without substantially affecting the input amplitude to the detector. The forward and feedback paths include attenuators that selectively insert a first predetermined relatively low attenuation into the forward loop while a second predetermined, high attenuation is inserted into the feedback path to achieve the highest output power range from the load. The attenuators are switched so that the relatively high attenuation is inserted into the forward path and the relatively low attenuation is inserted into the feedback path to provide the lowest output power range from the load. The output power in the relatively high and low ranges is controlled in a pair of additional steps by including a power divider in the forward path. The power divider couples forward path power to the feedback path and to the load via a microwave switch, while the switch is in a first position. A directional coupler in the forward path has one output arm for driving the power divider and a second output arm for coupling forward path power to the load via the switch while the switch is in a second position. The forward path power coupled to the second arm is attenuated differently from the forward path power coupled to the forward path via the switch while the switch is in the first position. The differential coupling is such that the power level supplied to the load has two different steps in each configuration of the attenuators that are selectively connected in the forward and feedback paths. The arrangement of the directional coupler and power divider and the connections of the attenuators are such that the input to the linear crystal amplitude detector is always in the relatively narrow amplitude range where the output of the detector is linearly related to the detector input.

To enable the power derived from the load to be maintained constant over the frequency range of the microwave source, the feedback path includes an equalizer attenuator having an attenuation versus frequency response that corresponds with the gain versus frequency response of the load. Thereby, as the power derived from the antenna has a tendency to vary as the frequency of the microwave source varies, the input to the linear crystal amplitude detector varies. Because of the linear characteristic of the amplitude detector, the amplitude detector derives an output voltage that controls the attenuation characteristics of the PIN diode attenuator to maintain a constant output level.

It is, accordingly, an object of the present invention to provide a new and improved apparatus for enabling the power derived from a microwave load to be maintained substantially constant in each of a plurality of relatively widely spaced amplitude ranges.

Another object of the invention is to provide a new and improved apparatus for maintaining the power derived from an antenna having a sloping gain versus frequency characteristic constant in each of a plurality of relatively widely spaced power ranges.

A further object of the invention is to provide a new and improved apparatus for controlling the output power of a microwave load in each of a plurality of relatively widely spaced power ranges by employing a feedback path having an amplitude detector with a desired input-output response over a relatively narrow amplitude range of inputs to it.

An additional object of the invention is to provide a microwave transmitter-antenna combination having a constant EIRP versus frequency response over approximately a 10% band width.

A further object of the invention is to provide a microwave transmitter-antenna combination having a constant EIRP in each of a plurality of power ranges extending over a 30 db interval.

The above and still further objects, features and advantages of the present invention will become apparent upon consideration of the following detailed description of one specific embodiment thereof, especially when taken in conjunction with the accompanying drawing.

BRIEF DESCRIPTION OF THE DRAWING

The sole FIGURE of the drawing is a combined block and circuit diagram of a preferred embodiment of the invention.

DETAILED DESCRIPTION OF THE DRAWING

Reference is now made to the sole FIGURE wherein there is illustrated a substantially constant amplitude microwave source 11, typically having a frequency anywhere in the range from 5.0 to 6.5 GHz. Energy from source 11 is coupled to microwave antenna 12 having a +6 db per octave gain versus frequency response in the frequency band of source 11. Source 11 and antenna 12 are coupled together via a network 13 including a segment 14 that is fixedly mounted relative to source 11 and a segment 15 that is commonly mounted on a pedestal with antenna 12. Segments 14 and 15 are interconnected via coaxial cables 16 and 17. In a preferred embodiment, segment 15 is placed in a weather-proof container mounted directly behind antenna 12 so that only a very short coaxial cable need extend between segment 15 and the antenna to minimize frequency sensitivity.

Network 13 includes forward and feedback paths 18 and 19. Forward path 18 includes a manually controlled resistive attenuator 21 that is directly responsive to source 11 and determines the minimum power level derived from antenna 12. Attenuator 21 drives voltage controlled PIN diode, variable microwave attenuator 22 having a substantially constant gain versus frequency response over the frequency band of source 11. Attenuator 22 comprises a pi-network including four shunt diodes and two series diodes connected to form a variable attenuation transmission line with input and output matching at four different attenuation levels introduced by network 13 between source 11 and load 12; the attenuation levels are 30, 20, 10 and 0 db. PIN diodes act as electrically variable resistors at the microwave frequencies of source 11, with each resistance inversely related to the forward bias current applied to it in a non-linear manner. Each diode is varied in resistance over a range of from approximately 10,000 ohms to less than 25 ohms in response to the DC bias current applied to it varying from a reverse bias condition to a maximum forward bias current of approximately 30 milliamperes. The total attenuation introduced by attenuator 22 ranges from a minimum of approximately 5 db to a maximum of approximately 30 db. The maximum attenuation is achieved in response to the series diodes being biased to an off condition and the shunt diodes being biased on, while the minimum attenuation occurs in response to the opposite conditions of the series and shunt diodes. In operation, the attenuation of attenuator 22 is controlled over this range by supplying individual signals to each series and shunt diode. The control signal for attenuator 22 is derived from feedback path 19 and varies from −0.5 to −2.0 volts DC.

The microwave output signal of attenuator 22 is supplied via network 24 to travelling wave tube amplifier 23 having a relatively constant gain over the band width of source 11. 20 db of attenuation is selectively inserted by network 24 in the signal fed by attenuator 22 to amplifier 23. Network 24 includes a directional coupler 25 having an input arm 26 connected to attenuator 22 and 0 and −20 db output arms 27 and 28. Output arms 27 and 28 are selectively coupled via microwave switch 29 to the input of amplifier 23. In the illustrated position of switch 29, the output of attenuator 22 is coupled directly, without attenuation, to the input of amplifier 23 and the −20 db signal derived from output arm 28 is coupled by a switch 29 to matching resistor 31. In the opposite, not illustrated position of switch 29, the output signal of attenuator 22 is coupled via output arm 28 to the input of amplifier 23, with 20 db of attenuation inserted, while the unattenuated signal at output arm 27 is coupled to matching resistor 31.

The output signal of amplifier 23 is coupled via cable 16 to input arm 32 of directional coupler 33, having 0 and −13 db output arms 34 and 35. The microwave signal at output arm 34 is coupled to input port 36 of 3 db power divider 37, having output ports 38 and 39. Equal power is derived from ports 38 and 39 and is respectively supplied to output circuit 40 and feedback path 19.

Output circuit 40 includes a microwave switch 42 having input ports that selectively couple the power derived from arm 35 to port 38 to antenna 12. In the illustrated position, switch 22 is activated so that the power derived from port 38 is coupled through switch 42 to antenna 12 and power from arm 35 is supplied to matching resistor 43. In the reverse, not illustrated position of switch 42, power from arm 35 is coupled by switch 42 to antenna 12 and the power from port 38 is coupled to matching resistor 43. Thereby, the position of switch 42 controls the power supplied by directional coupler 33 to antenna 12 in 10 db increments. In the illustrated position, a 3 db power loss exists between coupler 33 and antenna 12, by virtue of power divider 37. In the other position of switch 32, a 13 db power loss exists between coupler 33 and antenna 12 because of the 13 db insertion loss between input and output arms 32 and 35 of the coupler. The 10 db of attenuation selectively inserted by the position of switch 42 on the signal fed from coupler 33 to antenna 12 has no effect on the power level supplied by output port 39 to feedback path 19.

Feedback path 19 includes microwave switch 45 that selectively inserts 20 db attenuator 46 in the circuit with output port 47 of the switch. Switch 45 is mechanically driven in synchronism with switch 29 so that when switch 29 connects coupler 25 to the input of amplifier 23 with 0 db attenuation, switch 45 inserts 20 db attenuator 46 in the circuit with port 47. In an opposite manner, when switch 29 is activated so that the −20 db arm 28 of coupler 25 is inserted in the input of amplifier 23, switch 45 is activated so that there is a 0 db insertion loss between output port 39 of divider 37 and output port 47 of switch 45. Thereby, the gain factor of the circuit between input arm 26 of directional coupler 25 and output port 47 of switch 45 is always the same, regardless of the position of switches 29 and 45, as well as switch 42, in output circuit 40.

The signal at port 47 is supplied to equalizer attenuator 48, having a 6 db per octave attenuation versus frequency response corresponding with the gain versus frequency response of antenna 12 over the band width of source 11. Hence, at the low frequency end of source 11, where the gain of antenna 12 is low, the attenuation of attenuator 48 is maximum, while at the high frequency end of the source, were the gain of antenna 12 is maximum, the attenuation introduced by attenuator 48 is minimum. Thereby, the amplitude of the signal derived from attenuator 48 is directly proportional to the EIRP of antenna 12 for all frequencies in any particular power range. Of course, the microwave output level of attenuator 48 remains at a relatively constant level regardless of the power range selected by activation of switches 29, 42 and 45 because of the constant impedance inserted by the attenuating circuit connected to switches 29 and 45.

The relatively constant amplitude microwave signal derived from attenuator 48 is applied to linear crystal amplitude detector 49. Detector 49 has a linear input-output characteristic over the relatively limited range of amplitudes of the input signals applied to it, whereby the amplitude detector need not be specially designed to hande the 30 db variation in signal applied to antenna 12. Detector 49 derives a DC control voltage directly proportional to the amplitude of its input signal and hance indicative of the frequency applied by source 11 to antenna 12.

The DC output signal of detector 49 is applied to leveling amplifier 51 via cable 17. Leveling amplifier 51 responds to its input voltage to derive a variable amplitude DC voltage that controls the attenuation of diode 22. For proper operation, the gain of amplifier 51 is set to provide some minimum value at the frequency at which the input signal to detector 49 is a minimum. For an antenna 12 having the described characteristics, the response of attenuator 48 causes the minimum attenuation value of attenuator 22 to be at the low frequency end of the sprectrum of source 11. As the frequency of source 11 is increased, the output of attenuator 48 increases, resulting in a higher output of amplifier 51, to increase the attenuation of attenuator 22 so that decreased power is applied to antenna 12, and the antenna EIRP remains constant. Any non-linear characteristics of attenuator 22 for a particular control input voltage to it from amplifier 51 are compensated by adjusting the response of amplifier 51 in a non-linear manner. In addition, any other characteristics in the elements of network 13 which may prevent antenna 12 from having a constant EIRP in any of the power ranges are compensated by providing non-linearities in leveling amplifier 51. In general, components having a flat amplitude versus frequency response over the band width of source 11 are employed.

To provide the desired four power ranges, at 10 db increments, switches 29, 42, and 45 are operated in a predetermined sequence, as follows. For the maximum EIRP, switches 29, 42, and 45 are in the positions illustrated whereby there is a forward path insertion of 3 db, not including the attenuation of attenuators 21 and 22 and the gain of amplifier 23, and a feedback insertion loss of 20 db. For the next level, 10 db below the maximum, switches 29 and 45 remain in the illustrated position, but switch 42 is activated to the not illustrated position so that there is a 10 db forward path attenuation and a 20 db feedback path insertion loss. For the next lowest EIRP range, 20 db below the maximum EIRP, switches 29 and 45 are reversed from the illustrated condition, and switch 42 is in the illustrated position. Thereby, there is a 20 db forward path insertion loss and a 0 db feedback path insertion loss. For the lowest level EIRP, 30 db below the maximum EIRP, switches 29, 42 and 45 are reversed from the illustrated position. Thereby, there is a +30 db forward path insertion loss and 0 db feedback path insertion loss relative to the maximum EIRP situation.

While there has been described and illustrated one specific embodiment of the invention, it will be clear that variations in the details of the embodiment specifically illustrated and described may be made without departing from the true spirit and scope of the invention as defined in the appended claims.

What is claimed is:

1. An apparatus for deriving a substantially constant power level in each of a plurality of relatively widely spaced power ranges from a microwave load having a predetermined amplitude versus frequency response over a predetermined frequency band, the apparatus being responsive to a microwave source of substantially constant amplitude, comprising a forward path between the source and load, said forward path including a voltage controlled variable microwave gain device having a substantially constant gain versus frequency response over the predetermined frequency band, a feedback path responsive to the microwave power level in the forward path for deriving a control voltage for the variable gain device, said feedback path including a microwave device having an output amplitude versus frequency response corresponding substantially with the amplitude versus frequency response of the load and an amplitude detector responsive to the microwave device, and a plurality of attenuating means selectively connected in the feedback and forward paths for varying the power range supplied to the load.

2. The apparatus of claim 1 wherein the attenuating means includes means for maintaining the power level of the microwave input to the detector substantially constant even though different power ranges are supplied to the load.

3. The apparatus of claim 2 wherein the attenuating means includes means for selectively inserting a first predetermined attenuation into the forward path while a second predetermined attenuation is inserted into the feedback path and for inserting the second predetermined attenuation into the forward path while the first predetermined attenuation is inserted into the feedback path.

4. The apparatus of claim 3 wherein the attenuating means includes: a power divider in the forward path for coupling forward path power to the feedback path and to the load via microwave switch while the switch is in a first position, a directional coupler in the forward path having one output arm for driving the power divider and a second output arm for coupling forward path power to the load via the switch while the switch is in a second position, the forward path power coupled out of the second arm being attenuated differently from the forward path power coupled to the load via the switch while the switch is in the first position.

5. The apparatus of claim 2 wherein the attenuating means includes: a power divider in the forward path for coupling forward path power to the feedback path and to the load via a microwave switch while the switch is in a first position, a directional coupler in the forward path having one output arm for driving the power divider and a second output arm for coupling forward path power to the load via the switch while the switch is in a second position, the forward path power coupled out of a second arm being attenuated differently from the forward path power coupled to the load via the switch while the switch is in the first position.

6. The apparatus of claim 1 wherein the forward path includes a first directional coupler having an input arm responsive to microwave power derived from the variable gain device and output arms connected to input ports of a first switch having an output port selectively responsive to microwave power derived from one of the output arms of the first directional coupler, a second directional coupler having an input arm responsive to a replica of the power at the output port of the first switch and a pair of output arms, a power divider having an input port responsive to microwave power derived from one of the output arms of the second coupler and a pair of outlet ports, a second switch having first and second input ports respectively responsive to the power at the other output arm of the second coupler and power derived from one port of the power divider and an output port connected to the load, and a third switch responsive to power derived from the other output port of the power divider for selectively connecting a predetermined attenuation in series with the microwave device.

7. Apparatus for deriving a substantially constant power level in each of a plurality of relatively widely spaced power ranges from a microwave load, the apparatus being responsive to a microwave source of substantially constant amplitude, comprising a forward path between the source and load, said forward path including a voltage controlled variable microwave gain device, a feedback path responsive to the microwave power level in the forward path for deriving a control voltage for the variable gain device, said feedback path including a microwave device having an amplitude detector with a desired input-output response over a relatively narrow amplitude range of inputs to it so that the input to the detector should be maintained in the narrow range over all of the plural power ranges, and attenuating means selectively connected in the feedback and forward paths for varying the power range supplied to the load while maintaining the power level of the microwave input to the detector substantially constant.

8. The apparatus of claim 7 wherein the attenuating means includes means for selectively inserting a first predetermined attenuation into the forward path while a second predetermined attenuation is inserted into the feedback path and for inserting the second predetermined attenuation into the forward path while the first predetermined attenuation is inserted into the feedback path.

9. The apparatus of claim 8 wherein the attenuating means includes: a power divider in the forward path for coupling forward path power to the feedback path and to the load via a microwave switch while the switch is in a first position, a directional coupler in the forward path having one output arm for driving the power divider and a second output arm for coupling forward path power to the load via the switch while the switch is in a second position, the forward path power coupled out of the second arm being attenuated differently from the forward path power coupled to the load via the switch while the switch is in the first position.

10. The apparatus of claim 7 wherein the attenuating means includes: a power divider in the forward path for coupling forward path power to the feedback path and to the load via a microwave switch while the switch is in a first position, a directional coupler in the forward path having one output arm for driving the power divider and a second output arm for coupling forward path power to the load via the switch while the switch is in a second position, the forward path power coupled out of the second arm being attenuated differently from the forward path power coupled to the load via the switch while the switch is in the first position.

* * * * *